U S 007019313B2

(12) United States Patent
Yahiro (10) Patent No.: US 7,019,313 B2
(45) Date of Patent: Mar. 28, 2006

(54) METHODS AND DEVICES FOR EVALUATING BEAM BLUR IN SUBFIELDS PROJECTION-EXPOSED BY A CHARGED-PARTICLE-BEAM MICROLITHOGRAPHY APPARATUS (76) Inventor: Takehisa Yahiro, c/o Nikon Corporation (Intellectual Property Headquarters) Fuji Bldg. 2-3, Marunouchi 3-chome, Chiyoda-ku Tokyo 100 (JP)

( * ) Notice: Subject to any disclaimer, the term of this patent is extended or adjusted under 35 U.S.C. 154(b) by 0 days.

(21) Appl. No.: 11/023,823

(22) Filed: Dec. 27, 2004

(65) Prior Publication Data
US 2005/0127307 A1 Jun. 16, 2005

Related U.S. Application Data (63) Continuation of application No. 10/236,318, filed on Sep. 5, 2002, now abandoned.

(30) Foreign Application Priority Data
Sep. 5, 2001 (JP) ............................. 2001-268320

(51) Int. Cl.
H01J 37/304 (2006.01)
(52) U.S. Cl. ................................ 250/492.2; 250/492.1; 250/492.21; 250/492.23; 250/492.3
(58) Field of Classification Search ..................... None
See application file for complete search history.

(56) References Cited

U.S. PATENT DOCUMENTS

| 4,385,838 | A | | 5/1983 | Nakazawa et al. |
| 5,168,166 | A | * | 12/1992 | Hayakawa et al. ...... 250/492.2 |
| 5,396,077 | A | | 3/1995 | Sohda et al. |
| 5,633,507 | A | | 5/1997 | Pfeiffer et al. |
| 5,912,467 | A | | 6/1999 | Okino |
| 5,933,211 | A | | 8/1999 | Nakasugi et al. |
| 6,140,654 | A | | 10/2000 | Nakasugi et al. |
| 6,327,025 | B1 | | 12/2001 | Imai |
| 6,352,799 | B1 | | 3/2002 | Nakasuji |
| 6,403,971 | B1 | | 6/2002 | Kawata |
| 6,441,384 | B1 | | 8/2002 | Kojima |
| 6,521,392 | B1 | | 2/2003 | Yahiro |
| 6,522,386 | B1 | | 2/2003 | Nishi |
| 6,538,255 | B1 | | 3/2003 | Nakasuji |
| 6,831,282 | B1 | | 12/2004 | Yahiro |
| 2002/0148961 | A1 | * | 10/2002 | Nakasuji et al. ............ 250/311 |
| 2003/0075690 | A1 | * | 4/2003 | Yahiro ..................... 250/491.1 |
| 2003/0085365 | A1 | | 5/2003 | Yahiro |
| 2003/0089863 | A1 | * | 5/2003 | Hirayanagi ............... 250/492.2 |
| 2003/0128344 | A1 | | 7/2003 | Nishi |
| 2005/0127307 | A1 | * | 6/2005 | Yahiro ..................... 250/492.1 |

* cited by examiner

Primary Examiner—John R. Lee
Assistant Examiner—Bernard E. Souw (57) ABSTRACT

Methods and devices are disclosed for evaluating image performance in a charged-particle-beam (CPB) microlithography apparatus. In the disclosed method, multiple knife-edge reference marks are defined by a plate positioned at an image plane. The reference marks are illuminated by measurement beamlets formed by an upstream subfield. The beamlets are scanned over the reference marks to produce a series of beam-current transmissions. Each beam-current transmission corresponds to a single beamlet being scanned over a corresponding reference mark. The beam-current transmissions are exclusive of one another. The series of transmissions is then detected and analyzed. The knife-edge reference marks may be positioned on the plate so that the relative distance between the reference marks and the corresponding beamlets progressively increases for each successively scanned mark. A dummy beam also may be defined on the upstream subfield. The reference marks of the plate may be apertures or constructed of a charged-particle-reflecting material.

41 Claims, 10 Drawing Sheets

FIG. 3(B) — DETECTED BEAM-CURRENT WAVEFORM

FIG. 3(C) — DIFFERENTIAL WAVEFORM

METHODS AND DEVICES FOR EVALUATING BEAM BLUR IN SUBFIELDS PROJECTION-EXPOSED BY A CHARGED-PARTICLE-BEAM MICROLITHOGRAPHY APPARATUS

CROSS REFERENCE TO RELATED APPLICATION

This application is a continuation of, and claims the benefit of, U.S. patent application Ser. No. 10/236,318, filed on Sep. 5, 2002 now abandoned, which is incorporated by reference herein in its entirety.

FIELD

This disclosure pertains to microlithography (transfer-exposure of a pattern to a sensitive substrate). Microlithography is a key technology used in the fabrication of microelectronic devices such as integrated circuits, displays, and micromachines. More specifically, this disclosure relates to microlithography performed using a charged particle beam, such as an electron beam or an ion beam. Even more specifically, this disclosure pertains to methods and devices for evaluating the imaging performance of a CPB-microlithography apparatus.

BACKGROUND

Conventional charged-particle-beam (CPB) microlithography systems (typically using an electron beam as an exemplary charged particle beam) suffer from low throughput (i.e., the number of production units, such as wafers, that can be processed per unit time). To increase throughput, CPB projection-exposure apparatus (e.g., electron-beam steppers, etc.) have been developed that are capable of transferring large portions of the pattern to the substrate in one exposure "shot." In one such apparatus, termed a "divided-reticle" CPB-microlithography apparatus, the pattern is defined on a reticle divided into a large number of "subfields," each defining a respective portion of the pattern. Modern divided-reticle CPB-microlithography apparatus are configured to expose subfields measuring about 250 μm square (as exposed on the substrate). Simulation studies have revealed that the distribution of beam blur over such a large area is uneven. Simulation studies also have revealed that, whenever the current of a charged particle beam is increased in order to increase the throughput of the microlithography apparatus, space-charge effects also produce an uneven distribution of beam blur across the subfield. As a result, it is necessary to measure the distribution of beam blur at various points of the subfield with extremely high accuracy and precision. Based on these measurements, appropriate corrective adjustments can be made to the beam (e.g., of focal point, astigmatism, magnification, rotation, etc.), allowing the imaging performance of the microlithography apparatus to be improved.

Figure 10:
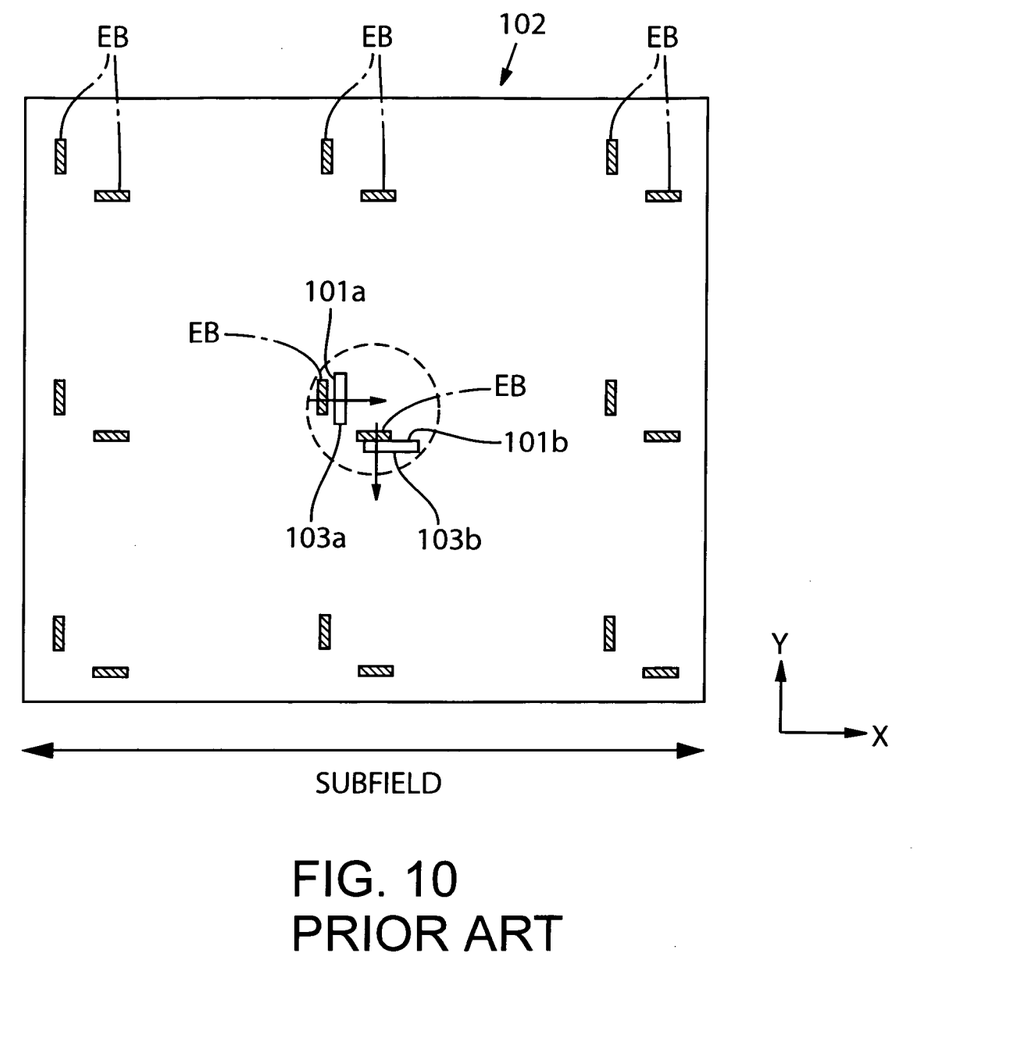
FIG. 10 is a schematic plan view of a plate showing relative size and shape relationships of two electron beamlets with respective knife-edge reference marks in a first conventional method for measuring imaging performance.

A conventional technique for measuring imaging performance is shown with reference to FIGS. 10–13. Referring first to FIG. 10, it is understood that an illumination-beam source and a reticle, although not shown, are located upstream of the components shown in the figure (i.e., above the plane of the page). The reticle is positioned in the "object plane". The multiple beamlets EB depicted in FIG. 10 are small electron beams produced by transmission of the illumination beam through respective rectangular measurement marks located in a subfield of the reticle. Hence, the beamlets EB that have passed through the measurement marks have rectangular transverse profiles. The beamlets EB are incident on a plate 102 that defines "knife-edge" reference marks 103a, 103b. The plate 102 is disposed on a wafer stage, which is positioned in the plane where the transferred image is to be formed (i.e., the "image plane"). The reference marks 103a, 103b are typically rectangular in profile and are configured as respective through-holes defined by the plate 102. The reference marks 103a, 103b define respective "knife-edges" 101a, 101b on which the beamlets EB are incident. The reference mark 103a is used for measuring beam blur along the X-direction of the plate 102, and the reference mark 103b is used for measuring beam blur along the Y-direction. In FIG. 10, nine X-direction reference marks 103a and nine Y-direction reference marks 103b are shown.

Figure 11:
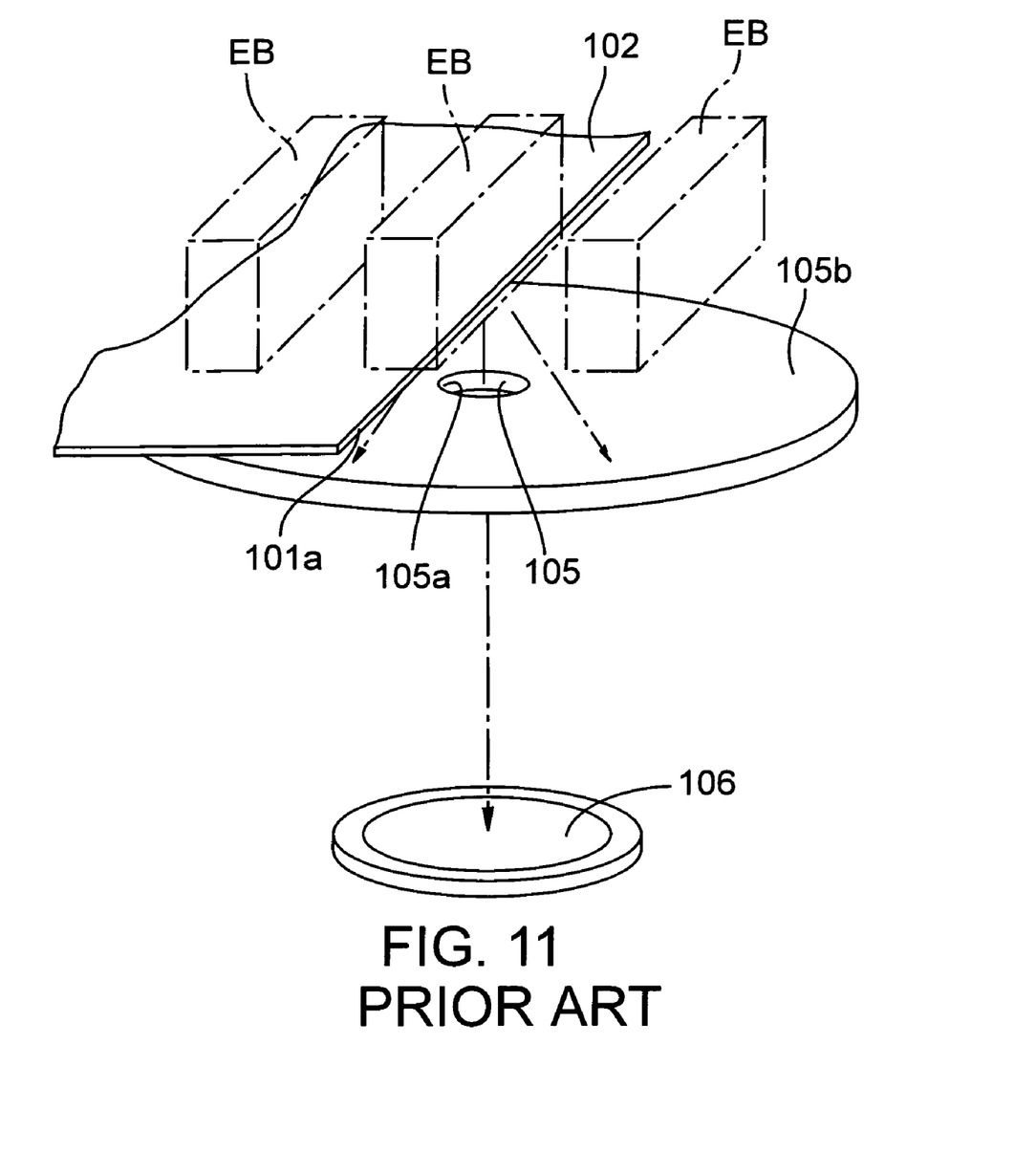
FIG. 11 is a schematic oblique view illustrating the first conventional method for measuring imaging performance.
Figure 12:
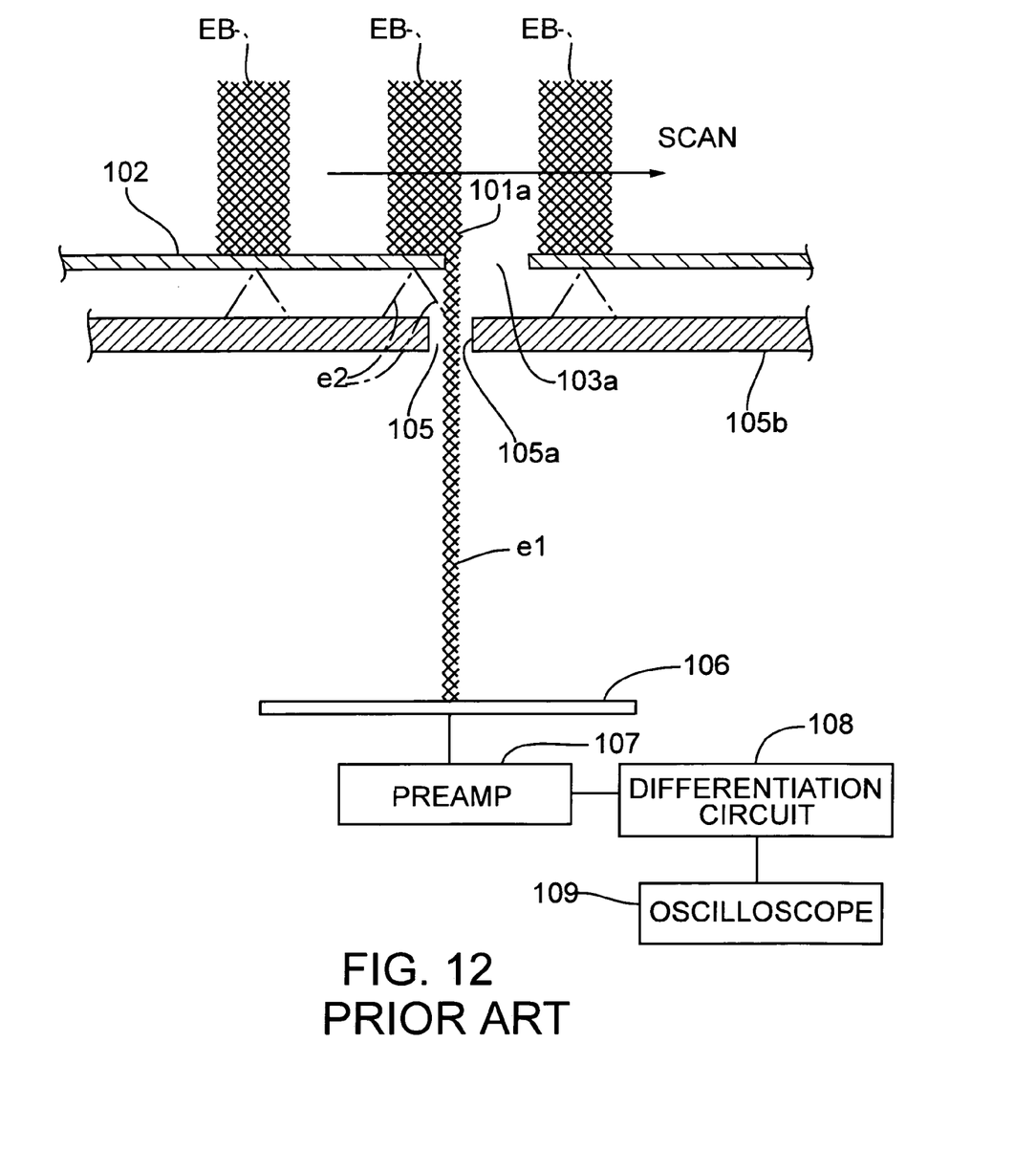
FIG. 12 is a schematic elevational view, with an accompanying block diagram, of the first conventional method for measuring imaging performance (corresponding to the method shown in FIG. 11).

The knife-edge 101a is shown in FIG. 11. A beam-limiting diaphragm 105b is disposed downstream of the knife-edge 101a. The diaphragm 105b is made of a sufficiently thick, conductive metal plate that absorbs electrons of an incident beamlet EB. The beam-limiting diaphragm 105b defines a beam-limiting aperture 105. An electron detector (sensor) 106 is disposed downstream of the beam-limiting aperture 105. As shown in FIG. 12, beam currents detected by the electron detector 106 are amplified by a pre-amplifier 107, converted to an output waveform by a differentiation circuit 108, and displayed on an oscilloscope 109 or analogous display.

As shown in FIG. 12, a beamlet EB is incident in a scanning manner over the knife-edge 101a and the reference mark 103a. As the beamlet EB is scanned in a direction indicated by the respective arrow (labeled "SCAN" and extending to the right in FIG. 12), electrons e1, which are transmitted through the reference mark 103a, and a portion of electrons e2, which are forward-scattered through the plate 102, are transmitted through the beam-limiting aperture 105. Thus, most of the forward-scattered electrons e2 are blocked by the beam-limiting diaphragm 105b, and most of the electrons transmitted through to the detector 106 are the non-scattered electrons e1. The distribution of beam blur (i.e., blur variation, or "Δblur") in the subfield can be measured by sequentially performing this measurement method for each of the nine knife-edge reference marks shown in FIG. 10.

Figure 13:
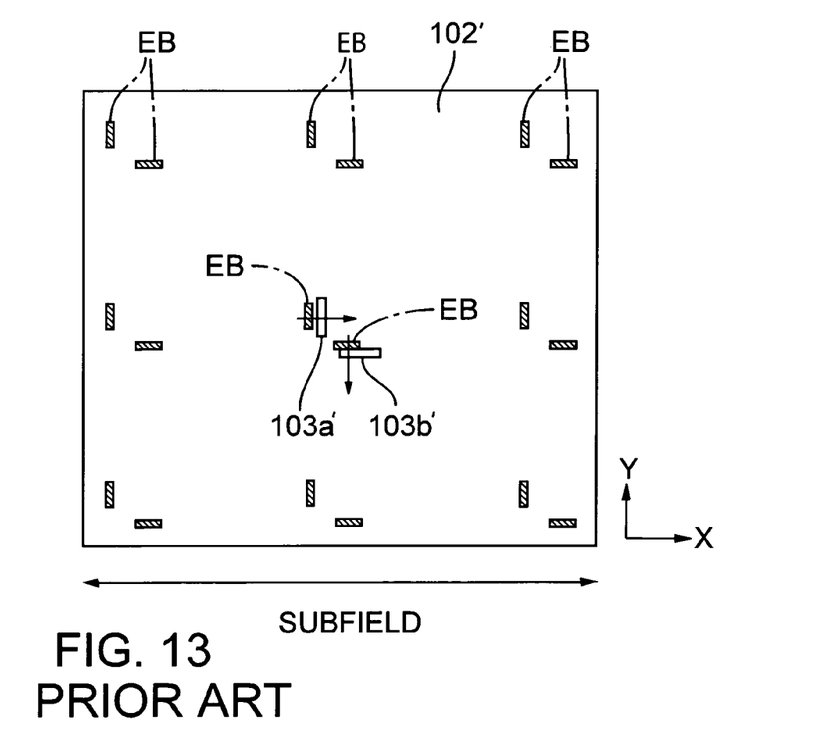
FIG. 13 is a schematic plan view of a plate showing relative size and shape relationships of two electron beamlets with the multiple reflective reference marks defined on the plate, in a second conventional method for measuring imaging performance.
Figure 14:
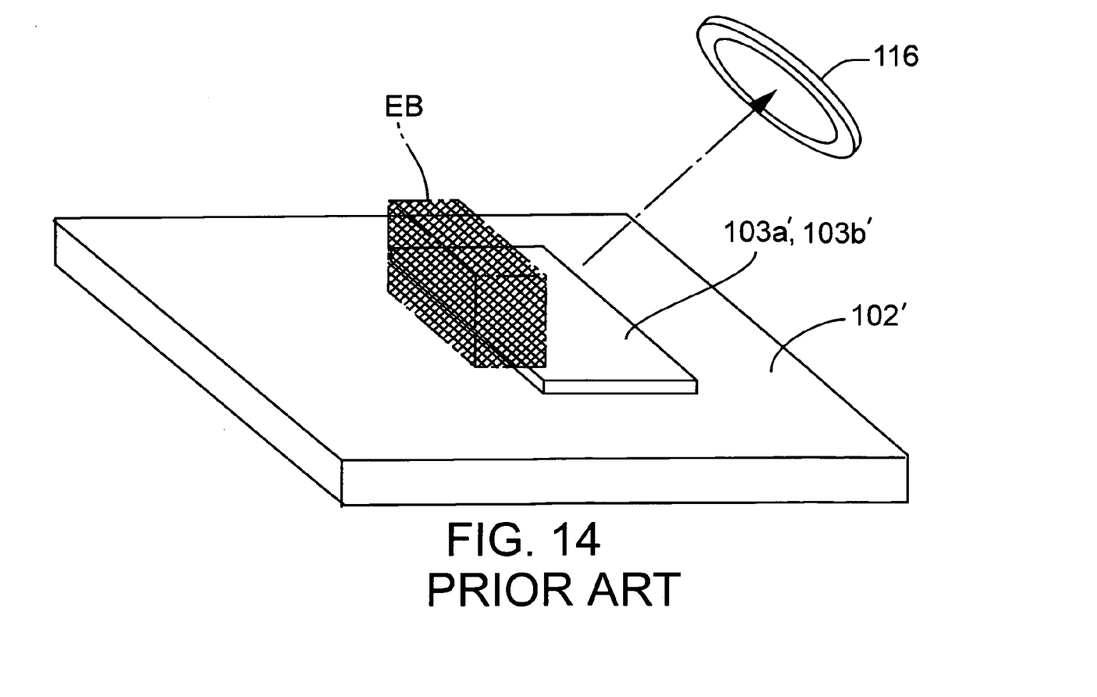
FIG. 14 is a schematic oblique view illustrating the second conventional method for measuring imaging performance, using the plate shown in FIG. 13.

A second conventional technique for measuring imaging performance is shown with reference to FIGS. 13–14. In FIG. 13, beamlets EB, as described above, are incident on a plate 102', which defines multiple reflective reference marks 103a', 103b'. Each reference mark 103a', 103b' is made of a thin film of heavy metal (e.g., Ta, W, etc.). The reference mark 103a' is used to measure beam blur along the X-direction of the plate 102', and the reference mark 103b' is used to measure beam blur along the Y-direction. In FIG. 13, nine X-direction reference marks 103a' and nine Y-direction reference marks 103b' are shown. FIG. 14 shows an electron detector 116 disposed above the reference marks 103a', 103b'. The detector 116 detects electrons that are incident on and reflected by the reference marks 103a', 103b' as the beamlet EB is scanned across the reference marks. The distribution of blur in the subfield is measured by sequentially performing the measurement method described above for each of the nine reference marks shown in FIG. 13.

In both of the conventional imaging-performance measurement techniques described above, beam blur resulting at each of the reference marks is measured individually (i.e., one at a time). Therefore, in order to measure the distribution of beam blur across an entire subfield, a large amount of time is needed.

SUMMARY

In view of the shortcomings of the prior art as summarized above, the present disclosure provides, inter alia, methods and devices for evaluating imaging performance in a charged-particle-beam (CPB) microlithography apparatus. In general, the disclosed methods enable the imaging performance of a CPB-microlithography apparatus to be evaluated quickly and with a high degree of accuracy. Specifically, the disclosed methods enable the beam blur at multiple locations of a projected subfield to be measured nearly simultaneously. Thus, the projection-optical system of the CPB exposure apparatus can be adjusted to correct for the beam blur quickly and easily.

A first aspect of the invention is set forth in the context of methods for measuring imaging performance. In an embodiment of the method, multiple beam-transmitting measurement marks are defined on a subfield positioned at an object plane, and multiple corresponding knife-edge reference marks are defined on a plate positioned at an image plane. The multiple measurement marks are illuminated simultaneously with a charged particle beam to form multiple measurement beamlets that propagate downstream toward the reference marks. The beamlets are projected onto the plate and scanned over the reference marks to produce a series of beam-current transmissions. The scanning of the reference marks can be performed in a single scan. Each beam-current transmission corresponds to one of the beamlets being scanned through a corresponding one of the reference marks, and is exclusive of any other beam-current transmission. The beam-current transmissions are detected by a detector. The signal input to the detector is time-divided for each of the reference marks and its corresponding measurement beamlet. The projection-optical system of the CPB-microlithography apparatus may be adjusted in accordance with the detected beam-current transmissions. The projection-optical system may be adjusted so that the maximum beam blur of a transferred image is minimized or so that the variation in blur is minimized.

In one embodiment, the reference marks have at least one knife-edge across which the corresponding beamlet is scanned. In another embodiment, the reference marks on the plate are positioned so that the relative distance between the reference marks and the corresponding beamlets progressively increases for each successive reference mark. For instance, the reference marks have a rectangular profile having a major and a minor dimension, wherein the increase of the relative distance is greater than or equal to the minor dimension of the reference mark that was scanned previously.

In another embodiment of the method, a beam-limiting diaphragm is positioned downstream of the reference marks. The beam-limiting diaphragm includes multiple beam-limiting apertures that correspond to respective reference marks. The beam-limiting apertures have respective "opening dimensions" (diameters, if the apertures are round) sufficient to block charged particles that are forward-scattered through the plate while not blocking charged particles that are transmitted through the reference marks. A second beam-limiting diaphragm also may be included, positioned downstream of the first beam-limiting diaphragm. The second beam-limiting diaphragm can include an aperture having an opening dimension sufficient to block charged particles that are forward-scattered through the plate while not blocking charged particles that are transmitted through the reference marks. By using the beam-limiting diaphragm(s) to block out unwanted charged particles, the beam-blur measurements made by the detector are made with high precision and nearly ideal contrast.

For performing these measurements while taking into account space-charge effects, a dummy pattern can be defined in a subfield of a reticle or analogous structure positioned at an object plane. Whenever a charged particle beam illuminates the subfield, the dummy pattern produces a dummy beam that propagates downstream, parallel to the beamlets, from the measurement marks. The dummy beam exerts a Coulomb force on the measurement beamlets and allows beam blur to be evaluated while taking into account space-charge effects.

The reference marks can be made of a material that backscatters charged particles of the incident beam. For instance, the reference marks can be made of a thin film of heavy metal (e.g., Ta or W). In an embodiment of a method performed using such reference marks, the detectors measuring the beam current are positioned opposite the reference marks in order to detect the reflected electrons.

According to another aspect of the invention, devices are provided for evaluating image performance of a CPB-microlithography device utilizing a method for evaluating imaging performance, as summarized above. An embodiment of the device includes multiple beam-transmitting measurement marks disposed on a subfield positioned at an object plane of the CPB-microlithography apparatus. The device further includes multiple reference marks defined on a plate located at an image plane of the CPB-microlithography apparatus. An illumination-optical assembly is situated and configured to direct a charged particle beam onto the measurement marks so as to form multiple measurement beamlets propagating downstream of the measurement marks toward respective reference marks. A projection-lens assembly is situated and configured to project the beamlets onto the plate and to scan the beamlets over the respective reference marks to produce a series of beam-current transmissions. Each beam-current transmission corresponds to a respective one of the beamlets being scanned through a corresponding one of the reference marks. Additionally, each beam-current transmission is exclusive of any other beam-current transmission. The device also includes a detector situated and configured to detect the beam-current transmissions. The device further may incorporate any of the various features summarized above.

According to yet another aspect of the invention, devices are provided for use in an imaging-performance measurement system, such as the system summarized above. An embodiment of such a device includes a plate disposed on a wafer stage of the CPB-microlithography apparatus. Multiple knife-edge reference marks are defined by the plate. Each reference mark is separated from the incidence locus of the corresponding beamlets by a respective relative distance, wherein the relative distance progressively increases for each successive mark. Each of the reference marks can have a rectangular profile including a major dimension and a minor dimension. The increase in relative distance may be greater than or equal to the minor dimension of a previously scanned reference mark. In another embodiment, the reference marks are positioned so that, whenever one of the reference marks is illuminated by the reference mark's corresponding beamlet, no other reference mark is illuminated simultaneously.

The foregoing and additional features and advantages of the invention will be more readily apparent from the following detailed description, which proceeds with reference to the accompanying drawings.

DETAILED DESCRIPTION

This invention is described below in connection with representative embodiments that are not intended to be limiting in any way. Although the various embodiments are described in the context of utilizing an electron beam as an exemplary charged particle beam, the general principles set forth herein are applicable with equal facility to the use of an alternative charged particle beam, such as an ion beam.

First Representative Embodiment

Figure 3A:
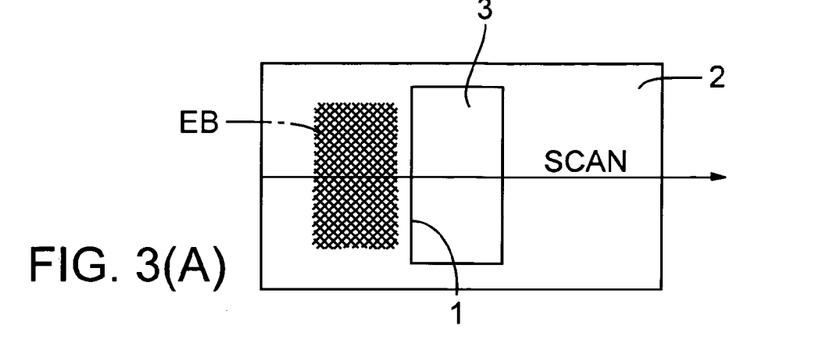
FIG. 3(A) is a schematic plan view of a beamlet EB being scanned over a knife-edge of the corresponding reference mark, as discussed with respect to the first representative embodiment.
Figure 3B:
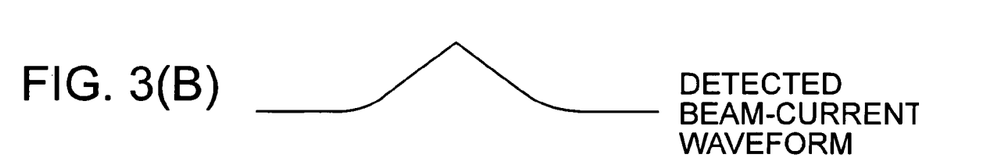
FIG. 3(B) depicts an exemplary plot of a single beam-current waveform detected by an electron detector situated downstream of the reference marks in FIG. 3(A).
Figure 3C:
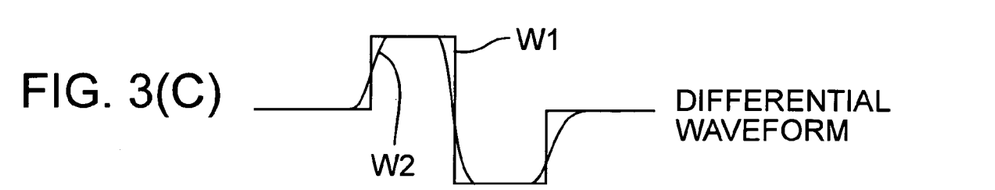
FIG. 3(C) depicts an exemplary plot of a single differential waveform derived from the plot in FIG. 3(B), showing both the ideal waveform and the actual waveform.
Figure 3D:
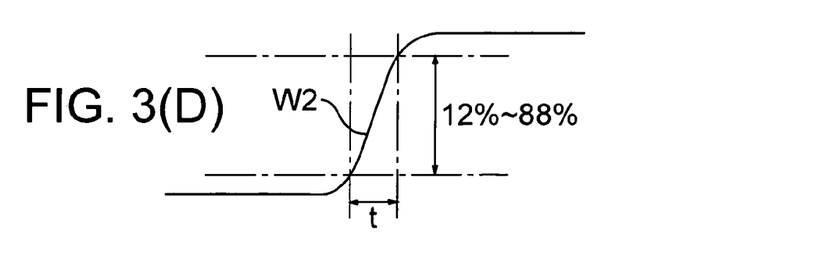
FIG. 3(D) is an enlargement of the rising portion of the actual differential waveform in FIG. 3(C).
Figure 4A:
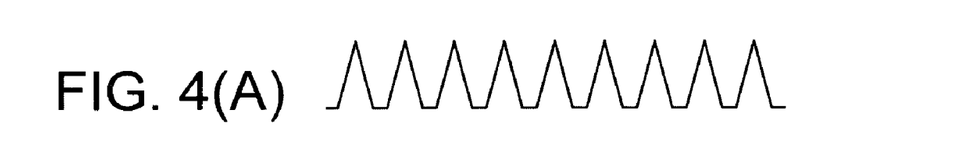
FIG. 4(A) depicts an exemplary plot of a series of beam-current waveforms measured in accordance with the first representative embodiment.
Figure 4B:
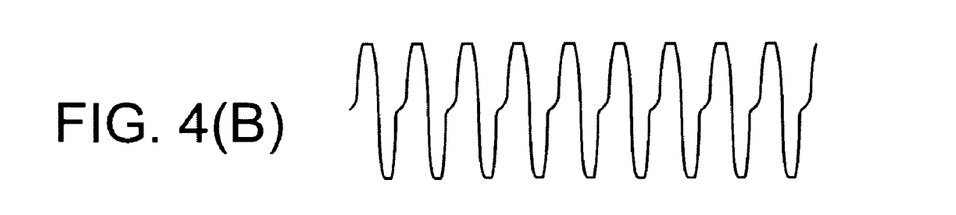
FIG. 4(B) depicts an exemplary plot of the differential waveform derived from the plot of FIG. 4(A).
Figure 5:
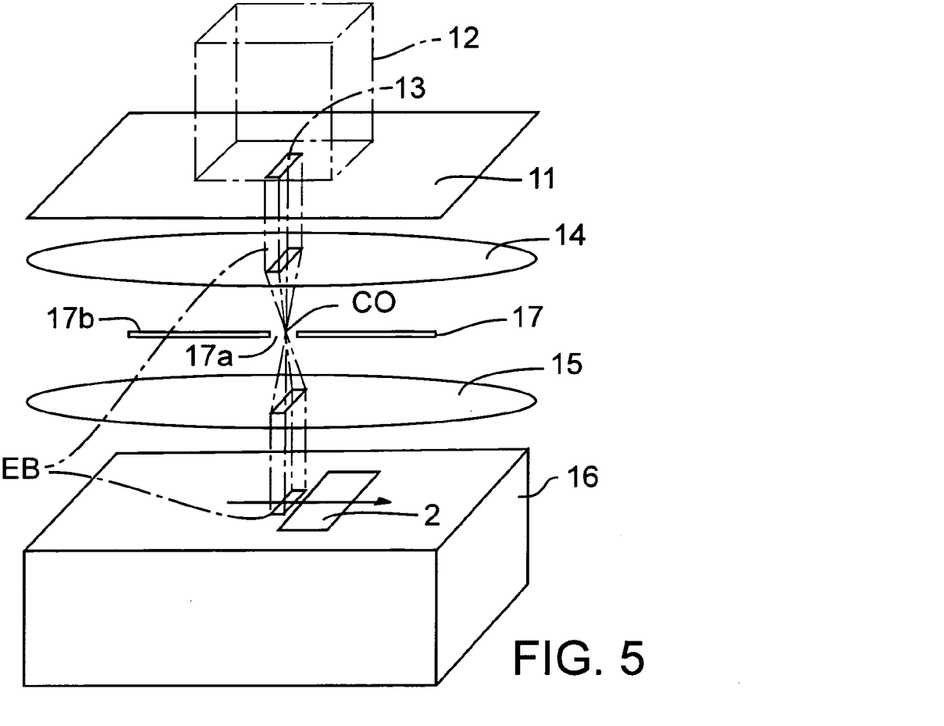
FIG. 5 is an oblique elevational view schematically illustrating the method of measuring beam blur according to the first representative embodiment.

FIGS. 1–6 illustrate a first representative embodiment of the disclosed imaging-performance measurement methods and devices. Turning first to FIG. 5, certain optical-system components of an electron-beam microlithography apparatus are shown in the vicinity of a wafer stage 16. At the upstream end of the depicted apparatus, an illumination beam 12 is shown incident on a subfield 11 of a divided reticle. The illumination beam 12 is emitted from an upstream electron gun (not shown) and formed by an illumination-optical system (not shown, but well understood to be located between the electron gun and the subfield 11) so as to be collimated as the beam is incident on the subfield 11. The subfield 11 defines multiple "measurement marks" as used for measuring beam blur. The subfield 11 also can define a respective portion of an actual lithographic pattern. The subfield 11 is situated at an "object plane" of the depicted system. Although a single measurement mark 13 is shown in FIG. 5, it is understood that multiple measurement marks may be defined on the subfield 11 (e.g., nine). In FIG. 5 the measurement mark 13 is a rectangular aperture (or through-hole) defined in a stencil-type reticle. It is understood, however, that the measurement mark in this or any other embodiment described herein may be defined on another type of reticle used in CPB microlithography (e.g., a scattering-membrane reticle). As the illumination beam 12 is incident on the measurement mark 13, a portion of the beam passes through the mark without experiencing any absorption or scattering of electrons. The portion of the beam 12 transmitted through the measurement mark 13 is a collimated beamlet EB having a rectangular transverse profile.

First and second projection lenses 14, 15, respectively, define a two-stage projection-lens system disposed downstream of the subfield 11. A contrast diaphragm 17 is situated between the projection lenses 14, 15. The beamlet EB formed by the measurement mark 13 in the subfield 11 is converged by the first projection lens 14 to form a crossover CO in the center of an aperture 17a defined by the contrast diaphragm 17. The contrast diaphragm 17 comprises a plate 17b that blocks electrons of the beamlet EB that were forward-scattered during passage of the illumination beam through the subfield 11 (i.e., only non-scattered electrons pass through the aperture 17a).

A wafer stage 16 is situated downstream of the second projection lens 15. The wafer stage 16 is configured to hold a suitable "sensitive" lithographic substrate, such as a semiconductor wafer. A plate 2 (not drawn to scale) is disposed on the wafer stage 16 and is configured as a thin silicon film having a thickness of about 2 μm. Multiple knife-edge reference marks are defined in the plate 2. The plate 2 on the wafer stage 16 is located in a plane representing an "image plane" of the depicted system. Mounted to the upstream-facing surface of the wafer stage 16 is a wafer chuck (not shown but well understood in the art) on which a wafer or other suitable substrate (not shown) is mounted for lithographic exposure.

Figure 6:
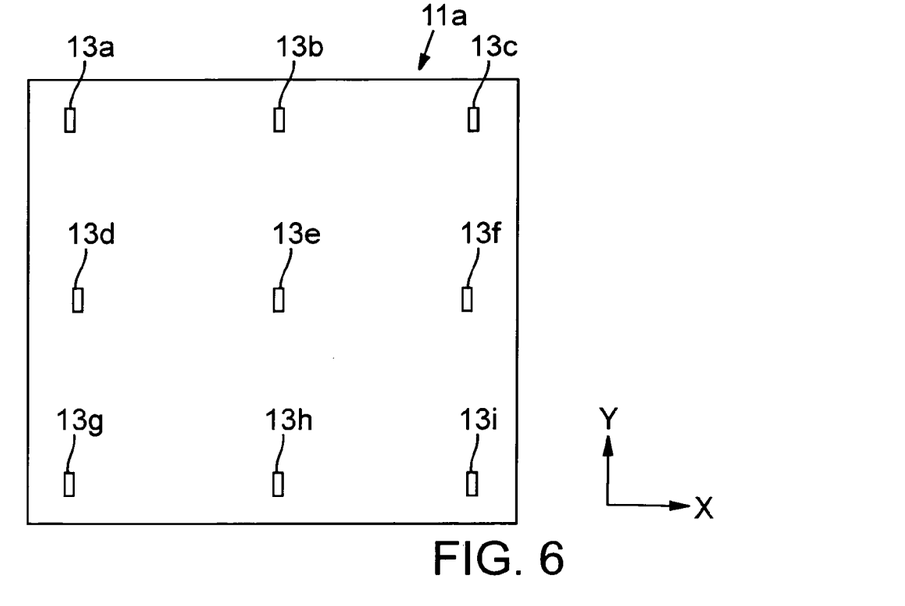
FIG. 6 is a schematic plan view of a subfield of a reticle defining multiple measurement marks that form respective measuring beamlets.

Turning to FIG. 6, a subfield 11a used for measuring beam blur along the X-direction is shown. The subfield 11a has an area of about 1-mm square, for example. Rectangular apertures (or through-holes) 13a–13i are formed uniformly across the subfield 11a in an arrangement consisting of three rows and three columns. Each of the apertures 13a–13i is oriented so that its major dimension extends in the Y-direction. An additional pattern of separate rectangular apertures for measuring beam blur in the Y-direction (i.e., with major dimensions extending in the X-direction) also may be defined on the subfield 11a.

Figure 1:
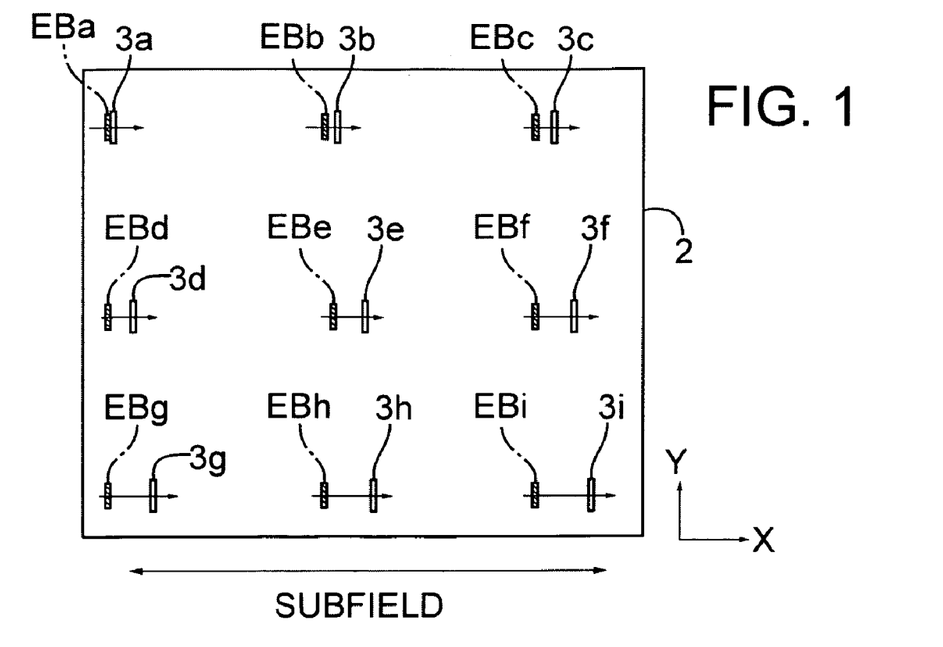
FIG. 1 is a schematic plan view of a plate illustrating the size and shape relationships of incident electron beamlets EBa–EBi and corresponding knife-edge reference marks in accordance with the first representative embodiment.

FIG. 1 shows a plate 2 defining multiple knife-edge reference marks 3a–3i according to this embodiment. The plate 2 is illuminated by the beamlets EB produced by the subfield of FIG. 6. The plate 2 is positioned at the image plane of the electron-beam microlithography apparatus and has a size substantially equal to the size of an image transferred from an upstream subfield (e.g., 250-µm square). Nine rectangular beamlets EBa–EBi are shown as projected onto the plate 2 in three equally spaced columns and three equally spaced rows. Nine reference marks 3a–3i are disposed on the plate 2 in three columns and three rows. Each of the marks 3a–3i has a major dimension extending in the Y-direction and that is slightly larger than the major dimension of the corresponding beamlet. The position of each of the marks 3a–3i relative to the respective beamlets EBa–EBi is shifted progressively in the positive X-direction for each successive mark (e.g., the reference mark 3b has an X-direction position relative to the beamlet EBb that is slightly greater than the X-direction position of the reference mark 3a relative to the beamlet EBa, etc.). For each successive mark, the increase of the relative distance may be greater than or equal to the minor dimension of the previous reference mark. Thus, the respective marks 3a–3i are positioned so that, whenever any one of the beamlets EBa–EBi overlaps its respective reference mark, no other beamlet is simultaneously overlapping its respective reference mark. Similar reference marks may be positioned on the plate 2 for measuring beam blur in the Y-direction.

Figure 2A:
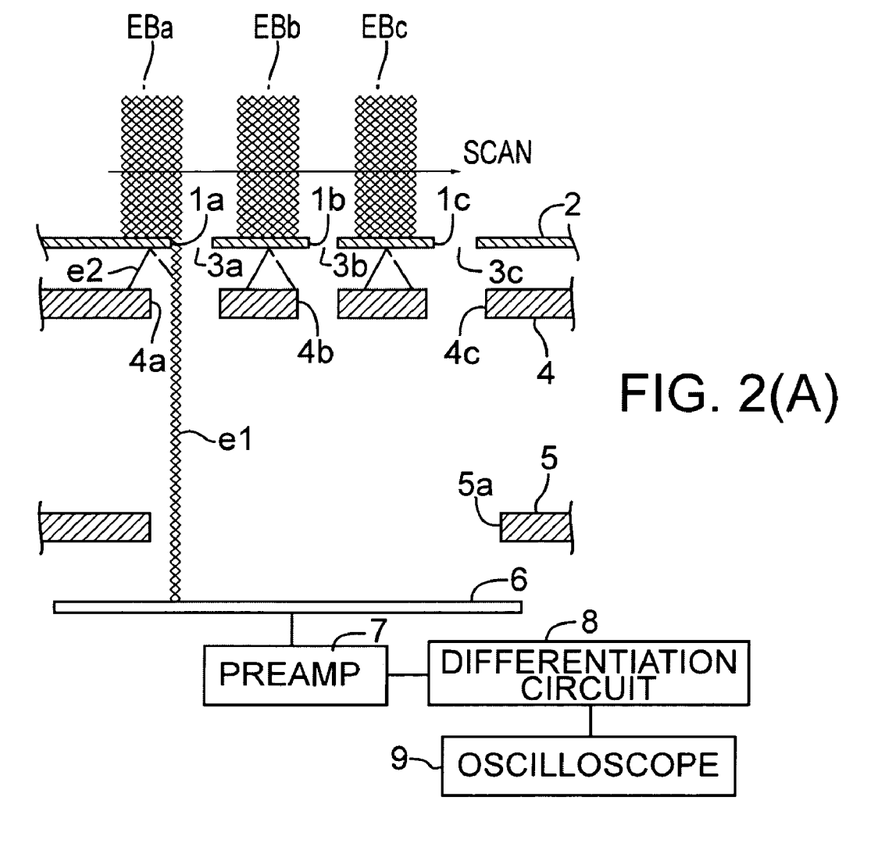
FIG. 2(A) is a schematic elevational view, with an accompanying block diagram, illustrating the manner in which imaging performance is measured according to the first representative embodiment.
Figure 2B:
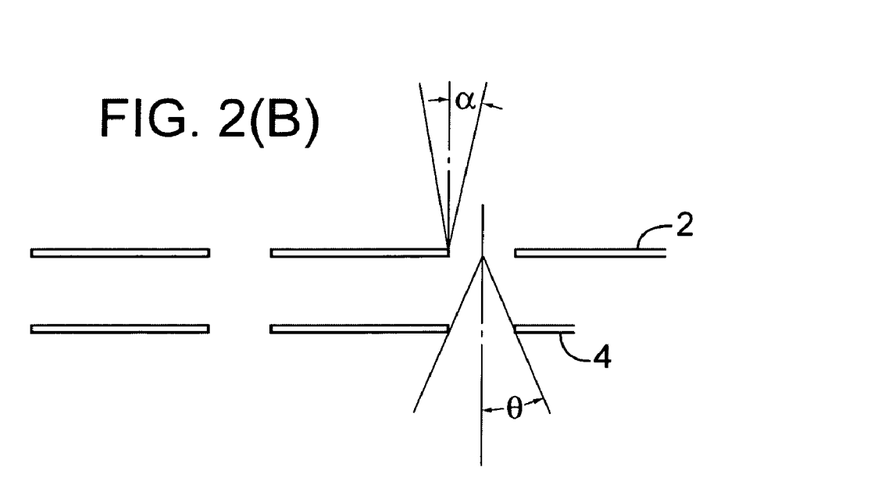
FIG. 2(B) is a schematic elevational diagram showing the angles α and θ with respect to a beam incident on edges of respective apertures in the plate 2 and diaphragm 4.

FIG. 2(A) is a schematic elevational view of the imaging-performance measurement method of the first representative embodiment. Beamlets EBa–EBc are formed by passage of the electron beam through respective apertures of the upstream subfield (see FIG. 6) and are incident on the plate 2. The reference marks 3a–3c of FIG. 1 are shown defining apertures on the plate 2. Each of the reference marks 3a–3c defines a respective knife-edge 1a–1c. As the beamlet EBa is scanned over the knife-edge 1a, the electrons e1 of the beamlet EBa pass through the reference mark 3a without scattering and propagate downstream.

A first beam-limiting diaphragm 4 with beam-limiting apertures 4a–4c that are aligned with the respective reference marks 1a–1c may be positioned immediately downstream of the plate 2. Although FIG. 2(A) shows only three beam-limiting apertures 4a–4c, the number of such apertures defined by the diaphragm 4 desirably equals the number of reference marks on the plate 2. In this example, for instance, the diaphragm 4 has nine apertures 4a–4i corresponding to the respective nine reference marks 3a–3i of the plate 2. The first beam-limiting diaphragm 4 desirably is made of a conductive metal and is sufficiently thick (e.g., 1 mm) to ensure absorption of incident beamlets. Desirably, each of the apertures 4a–4i has a width of approximately 10 µm. The axial distance between the plate 2 and the first beam-limiting diaphragm 4 is such that the nominal angle θ is slightly greater than the beam-convergence angle α of the beamlets EBa–EBi as they pass through the apertures (see FIG. 2(B)). For instance, if the beam-convergence angle α of the beam is 5 mrad, the axial distance between the plate 2 and the first beam-limiting diaphragm 4 might be 1 mm. Thus, when the beamlets EBa–EBi are scanned over the respective knife-edge reference marks 3a–3i, the electrons e1 passing through the reference marks also pass through the respective beam-limiting apertures 4a–4i. On the other hand, electrons e2 that are forward-scattered by the plate 2 or from a dummy beam (not shown) used to impart a space-charge effect are blocked almost completely by the first beam-limiting diaphragm 4. As a result, mostly non-scattered electrons e1 are transmitted downstream of the first beam-limiting diaphragm 4, thereby enhancing the contrast of beam-blur measurements performed using the device.

A second beam-limiting diaphragm 5 may be disposed at a position downstream of the first beam-limiting diaphragm 4. By way of example, this position may be approximately 10 mm to 20 mm below the first beam-limiting diaphragm 4. The second beam-limiting diaphragm 5 desirably is made of a conductive metal plate that is sufficiently thick (e.g., 1 mm) to ensure absorption of incident electrons. An aperture 5a is defined centrally in the second beam-limiting diaphragm 5 and has an opening dimension (e.g., diameter) sufficient to block forward-scattered electrons not blocked by the first beam-limiting diaphragm 4 while not blocking non-scattered electrons. For instance, the aperture 5a can have dimensions of approximately 200 µm to 500 µm. As a result, the contrast of the beam-blur measurements is further increased.

An electron detector (sensor) 6 is situated downstream of the plate 2 and the beam-limiting apertures 4a–4i, 5a. The electron detector 6 desirably comprises a combination of a photomultiplier and a scintillator, a Faraday cup, or a semiconductor detector. The electron detector 6 is connected to a pre-amplifier 7, a differentiation circuit 8, and an oscilloscope (or analogous display) 9.

FIGS. 3(A)–3(D) illustrate the manner in which an exemplary beamlet EB is measured by the electron detector 6 and displayed on the oscilloscope 9. As shown in FIG. 3(A), the beamlet EB is scanned over the knife-edge 1 of the reference mark 3 on the plate 2 in the direction of the "SCAN" arrow (i.e., to the right in the figure). As the beamlet EB passes over the knife-edge 1, the proportion of the beamlet EB propagating past (downstream of) the knife-edge progressively increases, indicated by a corresponding increase in beam current detected by the detector 6. As the scanning of the beamlet EB through the reference mark continues, the proportion of the beamlet EB propagating through the reference mark 3 peaks and eventually decreases, indicated by a corresponding decrease in beam current detected by the detector 6. Thus, as is shown in FIG. 3(B), a plot of the transmitted beam current detected by the detector 6 has a peaked profile. This beam-current transmission is amplified by the pre-amplifier 7 and converted by the differentiation circuit 8 to a plot of percentage change versus time. An exemplary differential waveform W2 output from the differentiation circuit 8 is shown in FIG. 3(C). Ideally, the differential waveform W2 has a rectangular profile W1 assuming the beamlet EB has no blur. In practice, however, the actual differential waveform W2 has sloped sides resulting from beam blur. As can be seen in FIG. 3(D), the distance "t" that is used to quantify beam blur is measured from where the beam intensity of the differential waveform is 12% of maximum to where the beam intensity is 88% of maximum.

As discussed above, the respective positions of the nine reference marks 3a–3i on the knife-edge plate 2 are shifted progressively along the X-direction (see FIG. 1). Thus, whenever the measurement beamlets EBa–EBi are scanned over the respective reference marks, the resulting beamlets propagate through the respective apertures 1a–1i one after another, thereby forming a series of nine contiguous, yet separate, beam-current transmissions that are detected by the detector 6. Differential processing can be performed on each of the transmissions so as to create nine respective differentiation waveforms that can be analyzed to measure the beam blur at different respective regions of the subfield. FIG. 4(A) shows nine exemplary beam-current waveforms corresponding to respective beam-current transmissions passing through each of the nine reference marks 3a–3i. The beam-current waveforms can be amplified and converted into plots of percentage change versus time by the differentiation circuit 8. The resulting differentiation waveforms are shown in FIG. 4(B). These differentiation waveforms may be displayed on the oscilloscope 9 (see FIG. 2(A)). Beam adjustment (e.g., calibration of focal point, astigmatism, magnification, rotation, and/or other parameters) and evaluation of imaging performance may be performed on the basis of these differentiation waveforms. Beam adjustments may be made so as to minimize maximum beam blur or to minimize the overall variation in beam blur (Δblur) within the subfield.

Second Representative Embodiment

Figure 7:
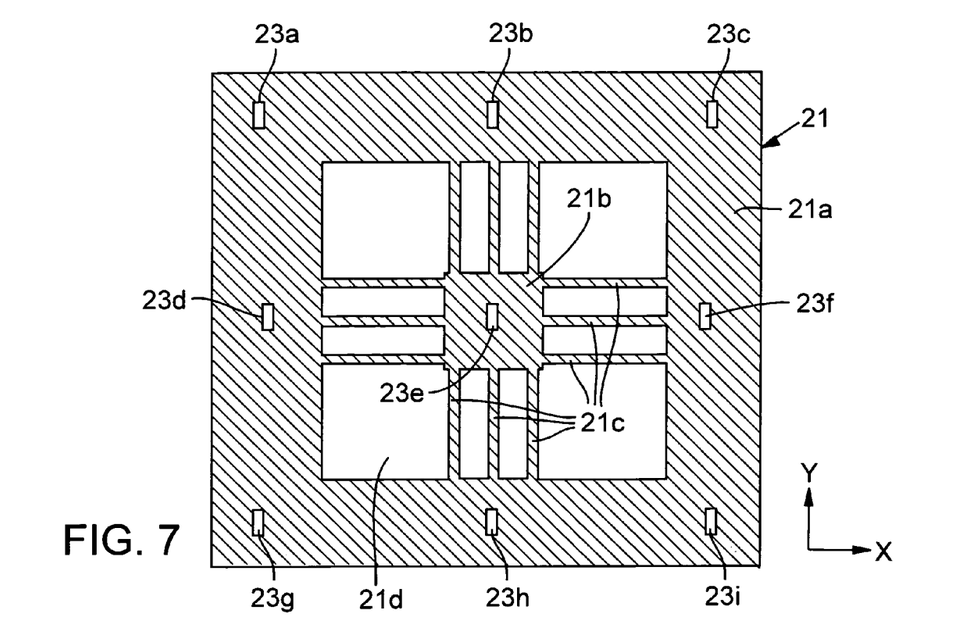
FIG. 7 is a schematic plan view of a subfield of a reticle defining multiple measurement marks that form respective measuring beamlets and a dummy beam in accordance with the second representative embodiment.
Figure 8:
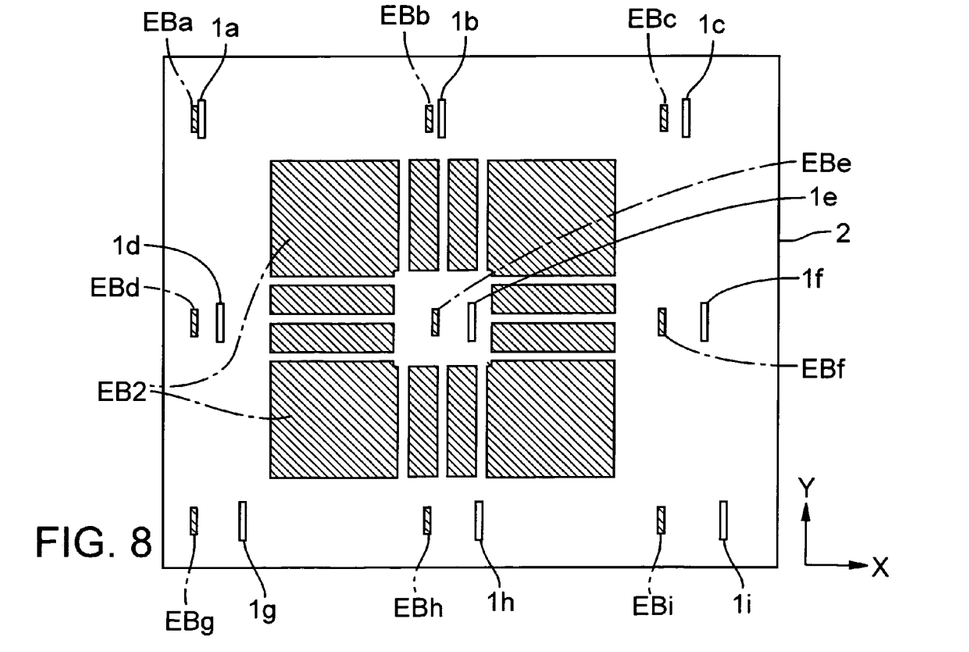
FIG. 8 is a schematic plan view of a plate illustrating relative size and shape relationships of electron beamlets, knife-edge reference marks, and the dummy beam in accordance with the second representative embodiment.

FIGS. 7–8 illustrate a second representative embodiment of the disclosed methods and devices. In general, the second representative embodiment is characterized by the use of a dummy beam, which is defined by the upstream subfield and projected adjacent to the measuring beamlets. The dummy beam exerts a Coulomb force on the measurement beamlets, thereby allowing beam blur to be measured under actual exposure conditions.

FIG. 7 shows a reticle subfield 21 that illustrates the size and shape relationships of the patterns used to define the measuring beamlets and the dummy beam. The subfield 21 includes an outer area 21a in the shape of a square frame, a center area 21b, and linking members 21c disposed around the center area to link the center area 21b with the outer area 21a. In the illustrated subfield 21, three linking members 21c per single side of the center area 21b are shown, although it is understood that other arrangements are possible. A large aperture (or through-hole) 21d is formed between the outer area 21a and the center area 21b, and defines the dummy beam. Rectangular apertures 23a–23i are formed at nine respective locations on the subfield 21 (eight in the outer area 21a and one in the center area 21b). Each of the apertures 23a–23i is oriented so that its major dimension is aligned with the Y-axis.

FIG. 8 shows the pattern from the subfield 21 as projected onto the plate 2. The portions of the illumination beam passing through the apertures 23a–23i on the subfield 21 form respective rectangular beamlets EBa–EBi. Similarly, the portions of the illumination beam passing through the aperture 21d form a dummy beam EB2. The dummy beam EB2 alters the beam current of each of the beamlets EBa–EBi so that the beam blur in the beamlets can be corrected for space-charge effects. I.e., the dummy beam EB2 exerts a Coulomb force on each of the measurement beamlets EBa–EBi, which allows beam blur to be evaluated while taking into account space-charge effects.

Third Representative Embodiment

Figure 9:
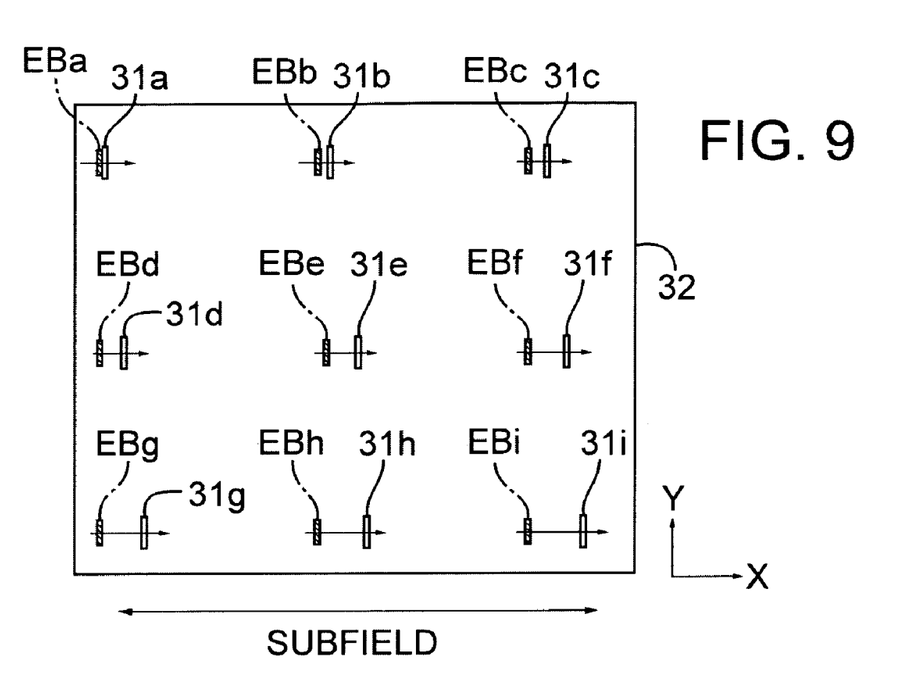
FIG. 9 is a schematic plan view of a plate illustrating relative size and shape relationships of electron beamlets and respective knife-edge reflective reference marks in accordance with the third representative embodiment.

FIG. 9 illustrates a third representative embodiment of the disclosed methods and devices. In general, the third representative embodiment is similar to any of the embodiments described above except that, in the third representative embodiment, the reference marks disposed on the plate are made of an electron-reflective material. Also, in this embodiment, beam blur is measured by detectors positioned opposite respective reference marks so as to detect backscattering of the incident beamlets from the reference marks. As is shown in FIG. 9, nine rectangular beamlets EBa–EBi are incident on a plate 32 as a result of passage of an illumination beam through respective apertures 13a–13i in an upstream subfield 11 (see FIG. 6). The rectangular beamlets EBa–EBi are distributed uniformly across the plate 32. Reference marks 31a–31i are disposed in three columns and three rows on the plate 32. Each of the marks 31a–31i is defined by a respective unit of thin film of heavy metal (e.g., Ta or W) and has a major dimension oriented in the Y-direction. Each major dimension is slightly larger than the major dimension of the respective beamlet EBa–EBi. Like the reference marks described above with respect to FIG. 1, the relative distances between the reference marks 31a–31i and their respective beamlets EBa–EBi progressively increases for each successive mark. In addition to the reference marks 31a–31i, which are used for measuring beam blur along the X-direction, the plate 32 may include nine reference marks (not shown) having major dimensions oriented in the X-direction. These additional reference marks are used for measuring the beam blur in the Y-direction. The X-direction reference marks and the Y-direction reference marks may be disposed collectively on a single plate 32.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A method for evaluating imaging performance in a charged-particle-beam (CPB) microlithography apparatus, comprising:

defining multiple beam-transmitting measurement marks on a subfield positioned at an object plane;

defining multiple corresponding reference marks by a plate positioned at an image plane;

illuminating the measurement marks with a charged particle beam to form multiple measurement beamlets propagating downstream toward the respective reference marks;

projecting the beamlets onto the plate;

scanning the beamlets over the reference marks to produce a series of beam-current transmissions, each beam-current transmission corresponding to a respective one of the beamlets being scanned through a corresponding one of the reference marks, and each beam-current transmission being exclusive of any other beam-current transmission; and detecting the series of beam-current transmissions.

2. The method of claim 1, wherein each of the reference marks comprises at least one respective knife-edge across which the respective beamlet is scanned.

3. The method of claim 1, wherein the step of defining multiple corresponding reference marks comprises defining the reference marks so that a relative distance between each reference mark and its corresponding beamlet progressively increases for each successive mark.

4. The method of claim 3, wherein each reference mark has a rectangular profile having a major dimension and a minor dimension.

5. The method of claim 4, wherein the increase of the relative distance is greater than or equal to the minor dimension of a previously scanned reference mark.

6. The method of claim 1, further comprising blocking charged particles that are forward-scattered through the plate while not blocking charged particles that are transmitted through the respective reference marks.

7. The method of claim 6, wherein the blocking step is performed by disposing a beam-limiting diaphragm downstream of the reference marks, the beam-limiting diaphragm comprising multiple beam-limiting apertures corresponding to respective reference marks and having respective opening dimensions sufficient to block the forward-scattered charged particles.

8. The method of claim 7, wherein the beam-limiting diaphragm is a first beam-limiting diaphragm, the method further comprising disposing a second beam-limiting diaphragm downstream of the reference marks and the first beam-limiting diaphragm, the second beam-limiting diaphragm comprising a beam-limiting aperture having an opening dimension sufficient to block charged particles that are forward-scattered through the plate while not blocking charged particles that are transmitted through the reference marks.

9. The method of claim 1, further comprising adjusting a projection-optical system of the CPB-microlithography apparatus in response to the detected series of beam-current transmissions.

10. The method of claim 9, wherein the adjusting step is performed so as to minimize blur of an image transferred to the image plane.

11. The method of claim 10, wherein the adjusting step is performed so as to minimize a variation in blur within an image of the subfield transferred to the image plane.

12. The method of claim 1, further comprising defining at least one dummy pattern on the subfield.

13. The method of claim 12, wherein:
the charged particle beam illuminates the dummy pattern to produce a dummy beam propagating downstream of the measurement marks; and
the detecting step further comprises detecting beam blur of the beamlets attributable to a space-charge effect caused by the dummy beam.

14. The method of claim 1, wherein the reference marks are defined as respective apertures in the plate.

15. The method of claim 1, wherein:
the reference marks are defined as respective electron-reflective reference marks on the plate; and
the detecting step is performed using a detector positioned opposite the reference marks.

16. The method of claim 15, wherein the electron-reflective reference marks are defined as respective units of a film of heavy metal formed on the plate.

17. The method of claim 1, wherein the scanning step is performed in a single scan.

18. A device for evaluating imaging performance in a charged-particle-beam (CPB) microlithography apparatus, comprising:
multiple beam-transmitting measurement marks disposed on a subfield positioned at an object plane of the CPB-microlithography apparatus;
multiple reference marks defined by a plate located at an image plane of the CPB-microlithography apparatus;
an illumination-optical system that directs a charged particle beam onto the measurement marks so as to form multiple measurement beamlets propagating downstream of the respective measurement marks toward the respective reference marks;
a projection-lens assembly that projects the beamlets onto the plate and scans the beamlets over the respective reference marks to produce a series of beam-current transmissions, each beam-current transmission corresponding to one of the beamlets being scanned through a corresponding one of the reference marks, and each beam-current transmission being exclusive of any other beam-current transmission; and
a detector that detects the series of beam-current transmissions.

19. The device of claim 18, wherein each reference mark comprises at least one knife-edge across which the respective beamlet is scanned.

20. The device of claim 18, wherein the reference marks are defined by the plate so that the relative distance between the reference marks and the corresponding beamlets progressively increases for each successive reference mark.

21. The device of claim 20, wherein each reference mark has a rectangular profile including a major dimension and a minor dimension.

22. The device of claim 21, wherein the increase of the relative distance is greater than or equal to the minor dimension of a previously scanned reference mark.

23. The device of claim 18, further comprising a beam-limiting diaphragm situated downstream of the reference marks, the beam-limiting diaphragm defining multiple beam-limiting apertures corresponding to respective reference marks and having respective opening dimensions sufficient for blocking charged particles that are forward-scattered through the plate while not blocking charged particles that are transmitted through the respective reference marks.

24. The device of claim 23, wherein the beam-limiting diaphragm is a first beam-limiting diaphragm, the device further comprising a second beam-limiting diaphragm situated downstream of the first beam-limiting diaphragm, the second beam-limiting diaphragm defining a beam-limiting aperture having an opening dimension sufficient to block charged particles that are forward-scattered through the plate while not blocking charged particles that are transmitted through the reference marks.

25. The device of claim 18, wherein the subfield further defines a dummy pattern configured to form a dummy beam relative to the beamlets.

26. The device of claim 18, wherein the reference marks are respective apertures formed in the plate.

27. The device of claim 18, wherein:
the reference marks are respective reflective reference marks; and
the detector is positioned opposite the reflective marks.

28. The device of claim 27, wherein each reflective reference mark is defined by a film of heavy metal.

29. The device of claim 18, wherein the projection-lens assembly is configured to scan the beamlets collectively in a single scan.

30. The device of claim 18, wherein the plate is attached to a wafer stage.

31. A charged-particle-beam microlithography apparatus, comprising a device as recited in claim 18.

32. In an imaging-performance measurement system of a charged-particle-beam (CPB) microlithography apparatus, a device for determining beam blur in a subfield of a pattern transfer-exposed by the CPB microlithography apparatus, the device comprising:
   a plate disposed on a wafer stage of the CPB-microlithography apparatus; and
   multiple knife-edge reference marks defined by the plate and separated from corresponding beamlets by a relative distance, the relative distance progressively increasing for each successive reference mark defined by the plate.

33. The device of claim 32, further comprising means for scanning the beamlets across the plate, wherein the increase in the relative distance is such that, when one of the reference marks is illuminated by a corresponding beamlet, no other reference mark is illuminated simultaneously.

34. The device of claim 32, wherein each reference mark has a rectangular profile, including a major dimension and a minor dimension.

35. The device of claim 34, further comprising means for scanning the beamlets across the reference marks, wherein the increase of the relative distance is greater than or equal to the minor dimension of a previously scanned reference mark.

36. The device of claim 32, wherein the reference marks are respective apertures defined in the plate.

37. The device of claim 32, wherein:
   the reference marks are configured to backscatter charged particles of a respective incident beamlet; and
   the detector is situated opposite the reflective marks.

38. The device of claim 37, wherein the reflective reference marks are made of a film of heavy metal.

39. In an imaging-performance measurement system of a charged-particle-beam (CPB) microlithography apparatus, a device for determining beam blur in a subfield of a pattern transfer-exposed by the CPB microlithography apparatus, the device comprising:
   a reticle stage for holding a reticle comprising multiple subfields, the reticle stage defining an object plane in which multiple measurement marks are defined, each measurement mark being configured to form a respective beamlet from a charged particle beam incident on the object plane; and
   a plate disposed on a wafer stage of the CPB-microlithography apparatus, the plate defining multiple knife-edge reference marks separated from the object plane by a relative distance, the relative distance progressively increasing for each successive reference mark defined by the plate.

40. The device of claim 39, further comprising means for scanning the beamlets across the plate, wherein the increase in the relative distance is such that, when one of the reference marks is illuminated by a corresponding beamlet, no other reference mark is illuminated simultaneously.

41. The device of claim 39, wherein:
   each reference mark has a rectangular profile, including a major dimension and a minor dimension; and
   the device further comprising means for scanning the beamlets across the reference marks, wherein the increase of the relative distance is greater than or equal to the minor dimension of a previously scanned reference mark.

* * * * *